United States Patent [19]

Katsura et al.

[11] Patent Number: 5,407,863
[45] Date of Patent: Apr. 18, 1995

[54] METHOD OF MANUFACTURING SEMICONDUCTOR DEVICE

[75] Inventors: Toshihiko Katsura, Kawasaki; Masahiro Abe, Yokohama; Tomoyuki Iguchi, Kawasaki, all of Japan

[73] Assignee: Kabushiki Kaisha Toshiba, Kawasaki, Japan

[21] Appl. No.: 798,706

[22] Filed: Nov. 29, 1991

[30] Foreign Application Priority Data

Nov. 30, 1990 [JP] Japan ................................ 2-336062
Nov. 12, 1991 [JP] Japan ................................ 3-296035

[51] Int. Cl.⁶ .......................................... H01L 21/44
[52] U.S. Cl. .................................... 437/197; 437/194; 437/196; 437/199; 437/203
[58] Field of Search ............... 437/194, 196, 197, 199, 437/203; 118/725

[56] References Cited

U.S. PATENT DOCUMENTS

| 4,495,221 | 1/1985 | Broadbent | 437/197 |
| 4,566,177 | 1/1986 | van de Van et al. | 437/194 |
| 4,796,562 | 1/1989 | Brors et al. | 118/725 |
| 4,837,183 | 6/1989 | Polito | |
| 4,970,176 | 11/1990 | Tracy et al. | 437/197 |
| 5,106,781 | 4/1992 | Penning De Vries | 437/203 |
| 5,108,951 | 4/1992 | Chen et al. | 437/197 |

FOREIGN PATENT DOCUMENTS 0107259 5/1984 European Pat. Off. .
0451571 10/1991 European Pat. Off. .

OTHER PUBLICATIONS

Dipankar Praminik and Arjun N. Saxena, "Aluminum Metallization for ULSI," Mar. 1990, *Solid State Technology*, vol. 33, No. 3; pp. 73–79.

*Primary Examiner*—Brian E. Hearn
*Assistant Examiner*—Kevin M. Picardat
*Attorney, Agent, or Firm*—Foley & Lardner

[57] ABSTRACT

To improve electromigration resistance and stress migration resistance, when a film is formed by depositing Al or Al alloy on a semiconductor substrate, the film is formed stepwise by stepwise changing the heating temperature of the semiconductor substrate at at least two stages.

3 Claims, 6 Drawing Sheets

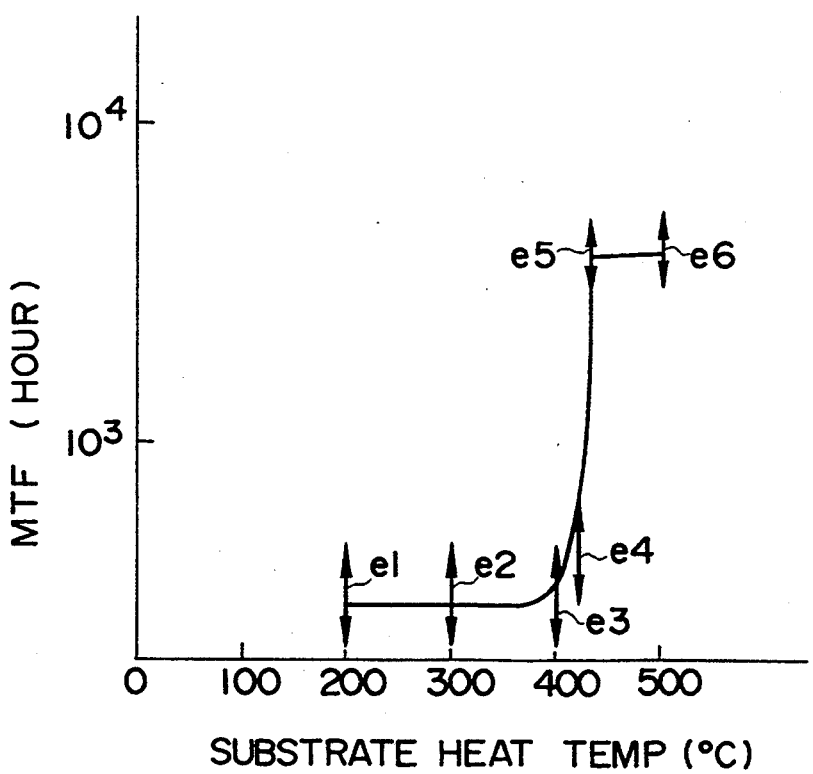
F I G. 10

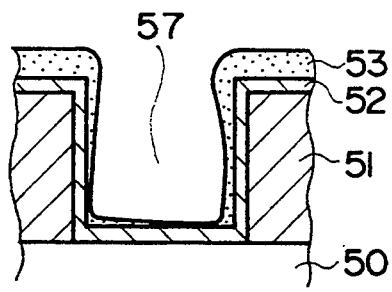
F I G . 11A
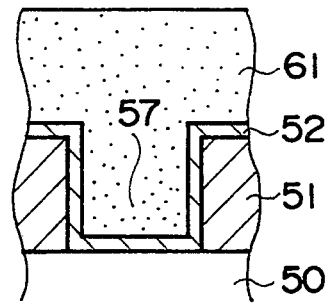
F I G . 12A
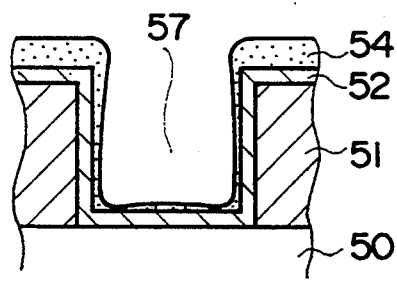
F I G . 11B
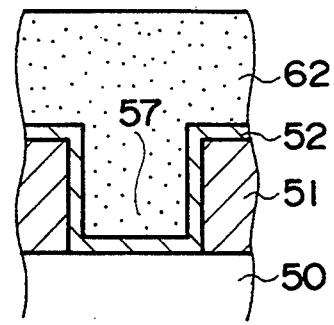
F I G . 12B
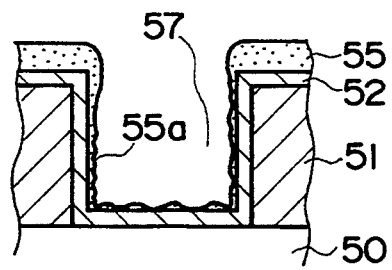
F I G . 11C
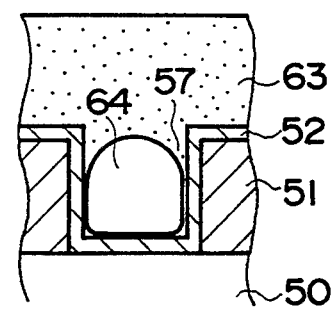
F I G . 12C
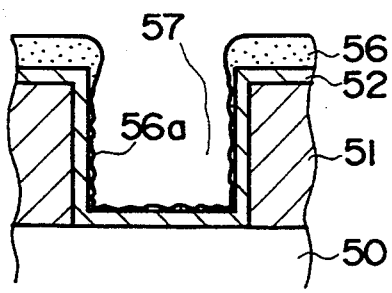
F I G . 11D
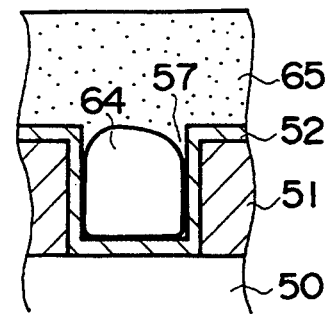
F I G . 12D

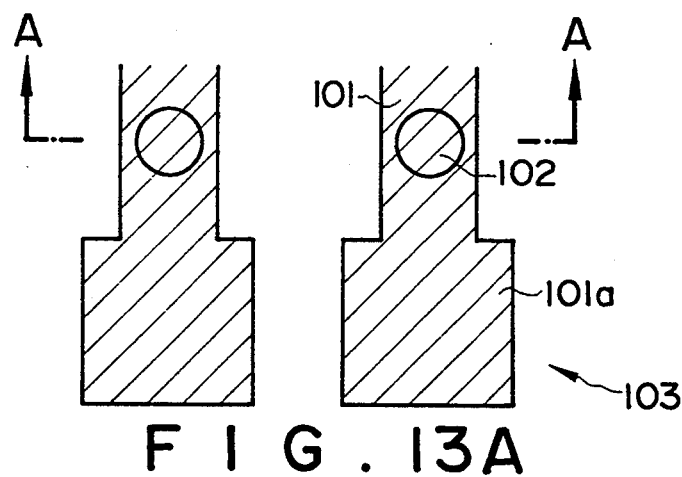
F I G. 13A
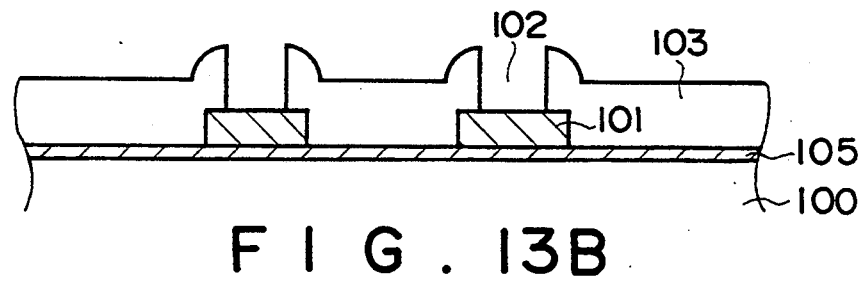
F I G. 13B
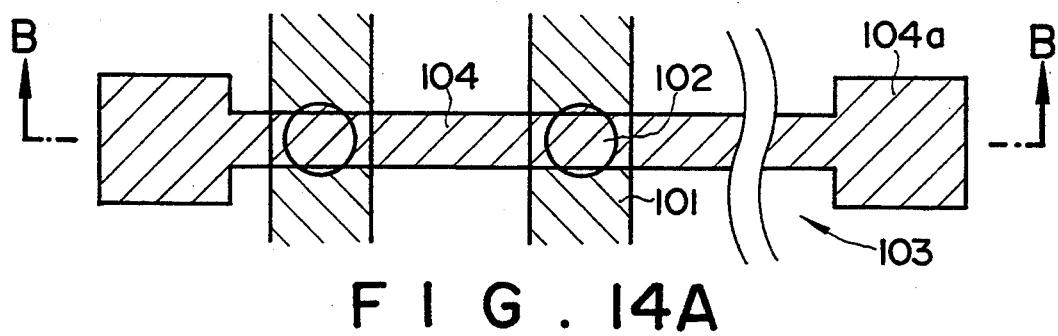
F I G. 14A
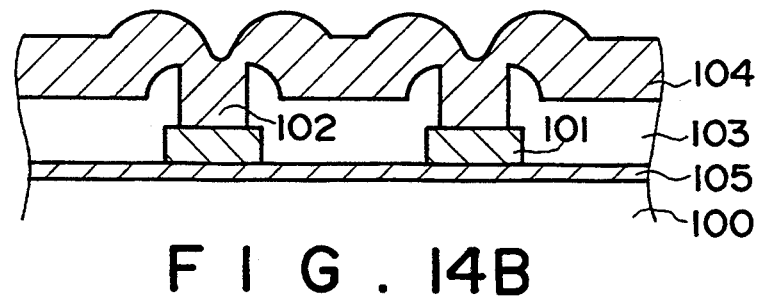
F I G. 14B

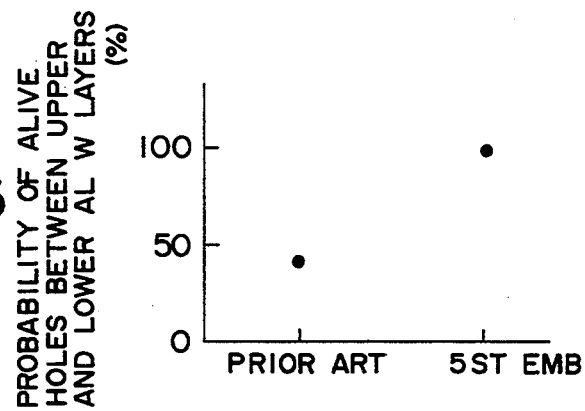
FIG. 15
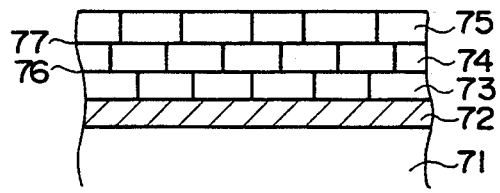
FIG. 16
PRIOR ART
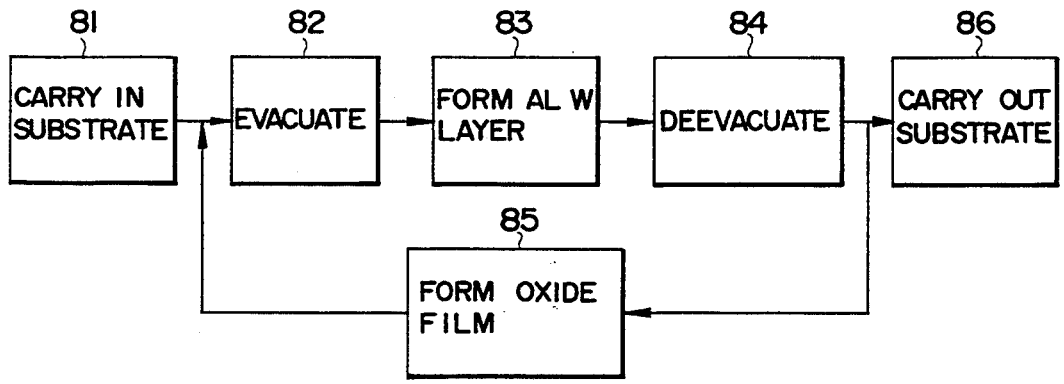
FIG. 17
PRIOR ART
FIG. 18
PRIOR ART
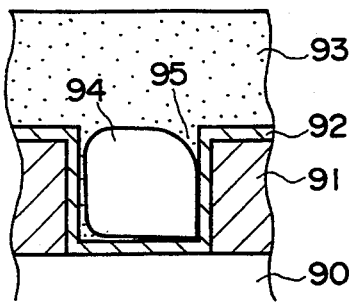

METHOD OF MANUFACTURING SEMICONDUCTOR DEVICE

BACKGROUND OF THE INVENTION

The present invention relates to a method of manufacturing semiconductor devices, and more specifically, to a method of forming wiring layers.

Aluminum (Al) and aluminium alloy (Al alloy) are widely used as material for wiring layers of semiconductor devices because of their low electric resistivity and high workability. resistivity and high workability. On the other hand, however, there exists a problem in that electromigration or stress migration easily occurs in wiring layers formed of Al or Al alloy. To prevent the above-mentioned defectiveness, although copper (Cu), titanium (Ti), lead (Pb) and/or silicon (Si) is added to the Al alloy, the effect of preventing the above-mentioned defectiveness is not yet so far satisfactory, because of the advance of wiring micronization.

In particular, electromigration and stress migration easily occur at interfaces between crystal grain boundaries. Therefore, the conventional countermeasures are such that an Al wiring layer is divided into several sublayers and Al oxide films ($Al_2O_3$) are interposed between the two divided Al wiring sublayers, respectively in order to prevent the interfaces from being arranged in the film thickness direction.

FIG. 16 shows a cross-sectional structure of conventional wiring layer. In the drawing, a silicon oxide film 72 is formed on the surface of a semiconductor substrate 71, and a first Al wiring sublayer 73 is formed by depositing Al or Al alloy on the oxide film 72 by sputtering. Further, another Al oxide film 76 is formed on the surface of the Al wiring sublayer 73 by oxidization. Here, there are several oxidization treatment methods; that is, the semiconductor substrate 71 formed with the Al wiring layer 73 is left within the atmosphere; the substrate is naturally oxidized within an oxide atmosphere; the heated substrate is left within the atmosphere or an oxide atmosphere; the substrate is kept in a pure water, etc.

In the above-mentioned methods, however, since the substrate is oxidized on the basis of natural oxidization, it is difficult to control the film thickness of the Al oxide film 76 with excellent reproducibility. In the case of an Al alloy including an additive such as Si in particular, local battery cells are formed therein and therefore, the film thickness of the Al oxide film tends to increase, so that the effect of separating the crystal grain interfaces is markedly subjected to the influence of the thickness of the Al oxide film. Namely, in the conventional manufacturing method, there exists a problem in that it is impossible to form an Al wiring layer excellent in electromigration resistance, stress migration resistance, and film thickness reproducibility, so that the reliability of the Al wiring layer is not high.

In the conventional manufacturing method, additionally, there exists another problem in that the productivity is low. FIG. 17 shows the conventional manufacturing process. In the drawing, the semiconductor substrate 71 formed with the silicon oxide film 72 is carried into an Al film forming equipment (in step 81); the Al film forming equipment is evacuated into a vacuum (in step 82); the first Al wiring sublayer 73 is formed on the surface of the silicon oxide film 72 on the semiconductor substrate 71 by sputtering (in step 83); the Al film forming equipment is deevacuated into the atmospheric pressure (in step 84); and the Al oxide film 76 is formed on the Al wiring sublayer 73 by means of either one of the above-mentioned oxidization methods (in step 85). The above steps 82 to 85 are repeated to form the Al wiring sublayer 74 and the Al oxide film 77, and the Al wiring sublayer 75 in sequence. In the conventional manufacturing method as described above, since the Al film forming equipment is repeatedly evacuated or deevacuated whenever an Al oxide film is formed, the productivity is low and therefore the manufacturing cost is high.

Further, contact holes or via-holes are easily formed on the surface of the Al wiring layer. To eliminate these holes, the semiconductor substrate is heated up to 460° C. or higher to melt Al or Al alloy when the Al wiring layer is being formed by sputtering. Further, since the melted Al or Al alloy is poor in wetting with respect to the silicon oxide film, a thin base film of titanium (Ti) or titanium nitride (TIN) must be once formed on the silicon oxide film, and thereafter the Al wiring layer is formed on the base film by sputtering at high temperature.

In the conventional method, however, there exists another problem in that a void is easily produced within a hole in the high temperature sputtering process. With reference to FIG. 18, in more detail, a hole 95 is formed in a silicon oxide film 91 on a semiconductor substrate 90, and a Ti thin film 92 is formed on the surface of the oxide film 91. In this case, a void 94 is produced at the hole 95 of the Al wiring layer 93. The existence of the void 94 deteriorates the resistance against electromigration or stress migration, thus causing lower reliability. The above-mentioned voids 94 increase with increasing microminiaturization of holes.

In summary, in the conventional method of manufacturing semiconductor devices, there exist various problems in that it is difficult to form Al wiring layer excellent in electromigration resistance, stress migration resistance, and reproducibility, so that the reliability and productivity of the Al wiring layer are not high.

SUMMARY OF THE INVENTION

Accordingly, it is the object of the present invention to provide a method of manufacturing semiconductor devices formed with Al wiring layers high in both electromigration and stress migration resistances, excellent in reproducibility, and low in manufacturing cost.

To achieve the above-mentioned object, the present invention provides a method of manufacturing semiconductor devices characterized in that when a film is formed by depositing Al or Al alloy on a semiconductor substrate, the film is formed stepwise by stepwise changing the heating temperature of the semiconductor substrate at at least two stages.

According to the present invention, when a film is formed on the semiconductor substrate by depositing Al or Al alloy, a film composed of at least two sublayers is formed stepwise by heating the semiconductor substrate at at least two different temperatures in stepwise fashion. In this case, since the substrate temperature changes stepwise, films having different crystal grain sizes can be laminated stepwise, so that the interfaces between crystal grain boundaries at the respective films are separated from each other without being arranged in the film thickness direction. Here, the thickness of the respective films can be controlled precisely by controlling the amount of Al or Al alloy to be deposited. In addition, the crystal grain sizes at the respective films are easily controlled at high precision by controlling the substrate heating temperatures. Therefore, it is possible to form a film high in electromigration and stress migration resistances and excellent in reproducibility.

Further, since a film with different crystal grain sizes can be laminated stepwise by changing the film forming speed in at least two stepwise fashion, and similarly the film is formed under the condition that the respective interfaces between crystal grain boundaries are not arranged in the film thickness direction. In this case, when the substrate is heated to 440° C. or higher, it is possible to improve the electromigration and stress migration resistances.

When a film is formed on a substrate having holes, Al or Al alloy can be deposited uniformly on the inside surfaces of the holes by heating the substrate at 180° C. or lower at the initial stage without producing via-holes, with the result that the electromigration and stress migration resistances can be improved.

Here, the initial stage differs according to the diameter and depth of the hole. For instance, the initial stage is determined until the film thickness at areas other than the holes reaches 1000 Å or more.

Further, it is possible to improve the electromigration and stress migration resistances at the areas other than the holes, when the film is formed by heating the substrate up to 460° C. or higher after the initial stages.

When a film is formed on a semiconductor substrate including holes, it is possible to prevent void from being produced within the holes, that is, to prevent the Al or Al alloy from being bridged over the holes, by reducing the film forming speed at the initial stage as compared with other stages. Here, the initial stage is determined until the film thickness at areas other than holes reaches 3000 Å or more.

Further, when the film forming speed is reduced and the semiconductor substrate is heated up to 460° C. or higher at the initial stage, since melted Al or Al alloy enters the hole gradually, it is possible to prevent voids from being produced.

BRIEF DESCRIPTION OF THE DRAWINGS

In the attached drawings,

FIG. 10 is a graphical representation showing changes in MTF values when the semiconductor substrate heating temperature is changed in the second embodiment of the method thereof;

FIGS. 11A–11D are longitudinal cross-sectional views for assistance in explaining the influence of the semiconductor substrate heating temperature at the initial stage when an Al wiring layer is formed on the semiconductor substrate having a contact hole;

FIGS. 12A–12D are longitudinal cross-sectional views for assistance in explaining the influence of semiconductor substrate heating temperature when an Al wiring layer is formed on the semiconductor substrate having a contact hole;

FIGS. 13A–13B are illustrations showing lower Al wiring layers, for evaluating comparison between the prior-art method and the fifth embodiment of the method thereof;

FIGS. 14A–14B are illustrations showing upper Al wiring layers formed in accordance with the prior-art method and the fifth embodiment of the method thereof;

FIG. 15 is a graphical representation showing the evaluation results of probability of alive holes of the Al wiring layers formed in accordance with the prior-art method and the fifth embodiment of the method thereof;

FIG. 16 is a longitudinal cross-sectional view showing the cross-sectional structure of the Al wiring layer formed in accordance with the prior-art method;

FIG. 17 is a flowchart for assistance in explaining the manufacturing steps of the prior-art method; and FIG. 18 is a longitudinal cross-sectional view showing the cross-sectional structure of an Al wiring layer formed on a semiconductor substrate having a contact hole in accordance with the prior-art method.

DESCRIPTION OF THE PREFERRED EMBODIMENTS

A first embodiment of the method of manufacturing semiconductor devices according to the present invention will be described hereinbelow with reference to the attached drawings. The method is characterized in that the heating temperature of the semiconductor substrate is stepwise changed when an Al or Al alloy wiring layer is formed on the substrate by sputtering.

Figure 1:
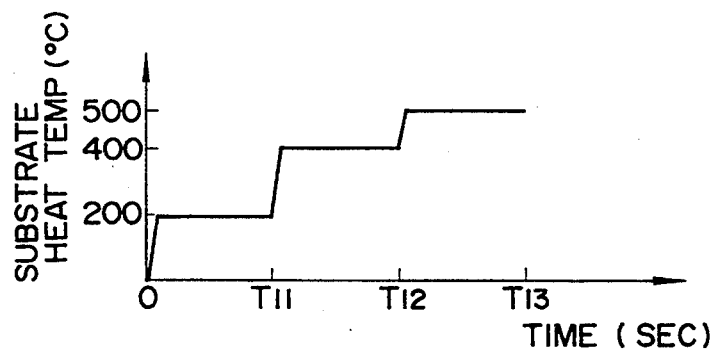
FIG. 1 is a graphical representation showing changes in heating temperature of the semiconductor substrate with respect to time in a first embodiment of the method of manufacturing semiconductor devices according to the present invention.

FIG. 1 shows changes in the heating temperature with respect to time. The semiconductor substrate is first heated at 200° C. till T11 sec, then at 400° C. till T12 sec after T11 sec, and finally at 500° C. till T13 sec after T12 sec. As described above, an Al wiring multilayer composed of three sublayers is formed by sputtering under the condition that the semiconductor substrate is heated by changing the heating temperature in three stepwise fashion.

Figure 2:
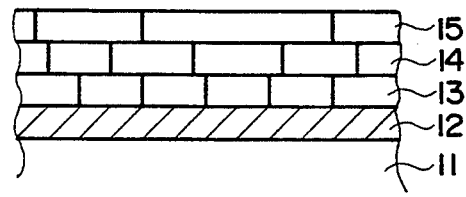
FIG. 2 is a longitudinal cross-sectional view showing the cross-sectional structure of an Al wiring layer formed in accordance with the first embodiment of the method according to the present invention.

FIG. 2 shows the cross-sectional structure of the Al wiring layer thus formed, in which three Al wiring sublayers 13, 14 and 15 formed of Al alloy (to which 1% silicon is added) are deposited in sequence. The film thicknesses of these Al wiring sublayers 13, 14 and 15 are 3000 Å, respectively. Since the heating temperatures of the semiconductor substrate 11 are different from each other, the sizes of crystal grains in the respective Al wiring sublayer 13, 14 and 15 differ from each other. The crystal grain size of the first Al wiring sublayer 13 is the minimum, because the heating temperature is the lowest as 200° C. The crystal grain size of the second Al wiring sublayer 14 is larger than that of the first Al wiring sublayer 13, because the heating temperature is higher as 400° C. The crystal grain size of the third Al wiring sublayer 15 is the maximum, because the heating temperature is the highest as 500° C.

In this embodiment, it is also possible to form the respective Al wiring sublayers by decreasing the substrate heating temperature in a stepwise fashion. In this case, the crystal grain sizes decrease from the first sublayer 13 to the third sublayer 15 in the direction opposite to the case shown in FIG. 2. Further, it is also possible to periodically alternate high and low substrate heating temperature in such a way that the first Al wiring sublayer is formed by heating the semiconductor substrate at a higher temperature as 400° C.; the second sublayer is formed by heating the substrate at a lower temperature as 200° C.; and the third sublayer is formed by heating the substrate with the highest temperature as 500° C. In this case, Al wiring sublayers of large and small crystal grain sizes are laminated alternately.

As described above, in the first embodiment of the manufacturing method according to the present invention, three Al wiring sublayers of different crystal grain sizes are laminated. Therefore, since the interfaces between adjoining crystal grain boundaries are offset from each other without being arranged in the film thickness direction, it is possible to prevent the occurrence of malconnection or disconnection of the wiring layer due to electromigration or stress migration. In this embodiment, the film thickness of the Al wiring sublayer can be precisely controlled to any desired value by controlling the deposition of Al or Al alloy during sputtering process, and further the crystal grain size is also controllable to any desired value by heating the substrate at any predetermined temperature, thus improving the reproducibility of the Al wiring layer and the reliability thereof.

Figure 3:
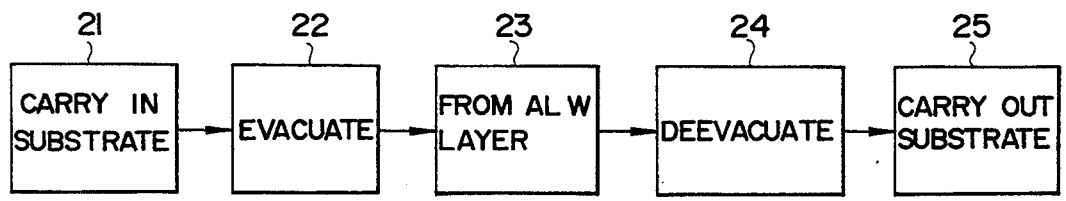
FIG. 3 is a flowchart for assistance in explaining the manufacturing steps of the method thereof.

Further, in this first embodiment, the manufacturing process can be simplified as shown in FIG. 3. In more detail, a semiconductor substrate is carried into an Al film forming equipment (in step 21); the Al film forming equipment is evacuated into a vacuum (in step 22); Al wiring sublayers are formed on the semiconductor substrate (in step 23), in which sputtering is effected by changing the stages (at which the semiconductor substrate is mounted), for instance to change the substrate heating temperature; the Al film forming equipment is deevacuated into the atmospheric pressure after the Al wiring sublayers have been formed (in step 24); and the semiconductor substrate formed with the Al wiring layer is carried out of the Al film forming equipment (in step 25). In the conventional manufacturing method, the evacuation and deevacuation must be repeated alternately whenever the Al oxide films (as already explained) are formed, so that the productivity is low. In contrast with this, in this embodiment, since no Al oxide films are required to be formed, only one evacuation and one deevacuation are sufficient. Further, it is also possible to eliminate the Al oxide film forming process itself, thus markedly increasing the productivity and decreasing the manufacturing cost.

The test results of the Al wiring layers manufactured by the first embodiment of the present invention will be described hereinbelow in connection with electromigration resistance. After a silicon oxide film had been formed on a semiconductor substrate, an Al wiring layer of three-sublayer structure including different crystal grain diameters was formed in accordance with the first embodiment of the method according to the present invention. The formed Al wiring sublayer was patterned in accordance with the ordinary photoetching method or reactive ion etching (RIE) method. The reliability test with respect to the electromigration resistance was made for a plurality of the Al wiring layers thus formed. In the wiring pattern to be tested, the wiring depth was 2 μm and the wiring length was 1 mm. The test temperature was determined at 200° C. and the current density was $2.0 \times 10^6$ A/cm². In addition, Al wiring layers formed in accordance with the prior art method were also prepared for comparison with those formed in accordance with the present embodiment.

Figure 4:
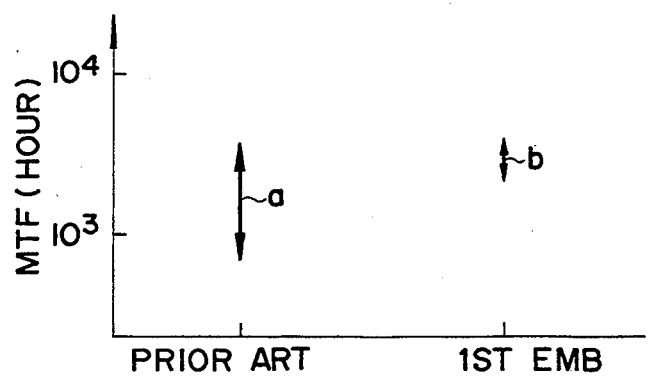
FIG. 4 is a graphical representation showing the test results of comparison between the prior-art method and the first embodiment of the method thereof.

FIG. 4 shows the test results, in which the solid line b indicates the mean time to failure (MTF) value of the Al wiring layers obtained in accordance with the first embodiment method and the solid line a indicates the same obtained in accordance with the prior art method. This MTF value is the time required when 50% of all the test samples becomes defective due to the occurrence of electromigration. In the case of the Al wiring layers manufactured in accordance with the prior art method, the MTF values range from 800 to 4000 hours, which indicates that it is difficult to form Al wiring layers excellent in electromigration resistance with good reproducibility. In contrast with this, in the case of the Al wiring layers manufactured in accordance with the first embodiment method, the MTF values concentrate in a range from about 3000 to 4000 hours, which indicates that it is possible to form Al wiring layers with excellent electromigration resistance and good reproducibility.

The above test results were obtained when the Al wiring layers were of three-sublayer structure as shown in FIG. 2. Without being limited thereto, however, it was confirmed that Al wiring layers with excellent electromigration resistance and good reproducibility were obtained when the wiring layers of two-sublayer structure were formed by heating the substrates at two different temperature of 200° C. and 500° C.

Some examples of the first embodiment have been described hereinabove. Without being limited thereto, the first embodiment can be modified in various ways. For instance, the same effect can be obtained as far as the substrate heating temperatures are different according to the respective divided Al wiring sublayers. Further, there exists no problem if the number of the divided Al wiring sublayers is four or more, without being limited to 2 or 3 divided sublayers.

A second embodiment of the manufacturing method according to the present invention will be described hereinbelow. The second embodiment is characterized in that the film forming speed is stepwise changed when the Al wiring layer is formed on the substrate. It is possible to change the film forming speed by changing the speed or density of ions generated in argon (Ar) gas and collided against an Al target, for instance.

Figure 5:
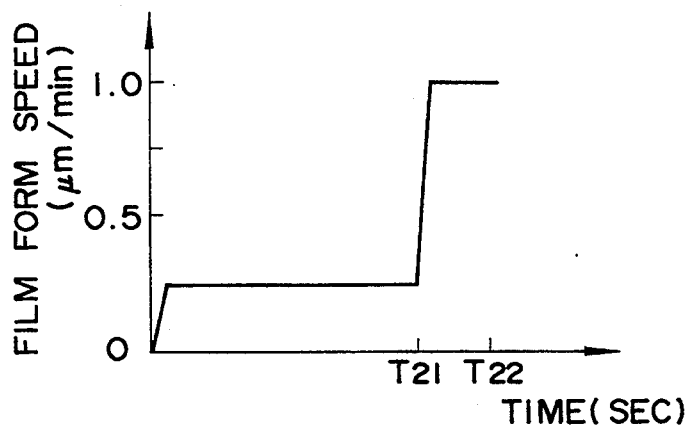
FIG. 5 is a graphical representation showing changes in film forming speed of the semiconductor substrate with respect to time in a second embodiment of the method of manufacturing semiconductor devices according to the present invention.

FIG. 5 shows changes in Al film forming speed with respect to time when the Al film is formed on the substrate by depositing Al alloy by sputtering. The film forming speed is changed at two stages in such a way that the speed is 0.25 (μm/min) from the start to the time point T21 and then 1.0 (μm/min) from the time point T21 to T22. Further, the heating temperature of the semiconductor substrate is 500° C. and the Al film thickness is 5000 Å at each stage. The target material is an Al alloy including 1% silicon.

Figure 6:
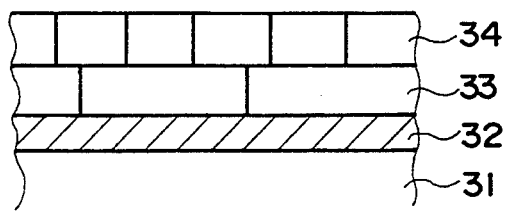
FIG. 6 is a longitudinal cross-sectional view showing the cross-sectional structure of an Al wiring layer formed in accordance with the second embodiment of the method according to the present invention.

FIG. 6 shows a longitudinal cross section of the Al wiring layer of two divided sublayer structure formed in accordance with the method as described above. Being different from the first embodiment, although the heating temperature of the semiconductor substrate 31 is kept constant at 500° C., since the film forming speed is changed at two stages, the crystal grain sizes are different from each other between the two divided Al wiring sublayers 33 and 34 formed on the silicon oxide film 32. When Al alloy is deposited on the silicon oxide film 32 by sputtering, the deposited Al alloy is diffused and moved on the surface thereof on the basis of the phenomenon referred to as surface migration. When the film forming speed is slow, since the speed at which the Al alloy is deposited is slow, the Al alloy deposited on the surface is easy to migrate and therefore the migration distant is large so that the crystal grain size is large. In contrast, when the film forming speed is high, since the deposition speed is high, the Al alloy deposited on the surface is difficult to migrate, so that the crystal grain size is small.

The film forming speed at which the first divided Al wiring sublayer 33 is formed is slow as 0.25 (μm/min) and the speed at which the second divided Al wiring sublayer 34 is high as 1.0 (μm/min). Accordingly, the crystal grain size of the first divided Al wiring sublayer 33 is larger than that of the second divided Al wiring sublayer 34.

Figure 7:
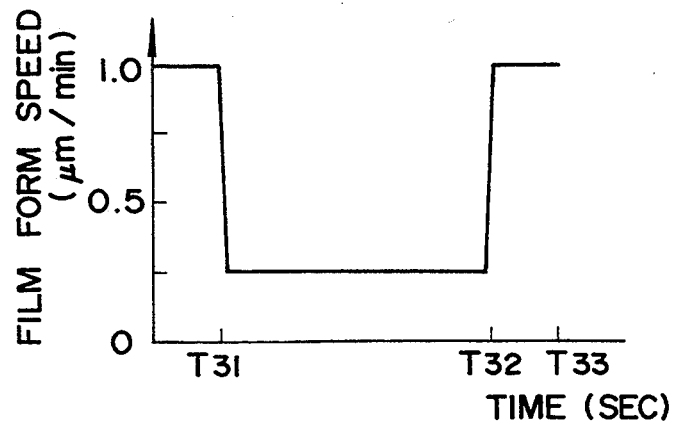
FIG. 7 is a graphical representation showing changes in the film forming speed of the semiconductor substrate with respect to time in a third embodiment of the method of manufacturing semiconductor devices according to the present invention.

FIG. 7 shows the third embodiment of the present invention, in which the film forming speed is changed at three stages. The film forming speed is determined as 1.0 (μm/min) from the start to the time point T31, 0.25 (μm/min) from the time point T31 to T32, and 1.0 (μm/min) from the time point T32 to T33. The heating temperature of the semiconductor substrate is 500° C. in the same way as with the case of the second embodiment, and the material is an Al alloy including 1% silicon. The film thickness is 3333 Å at the respective stages.

Figure 8:
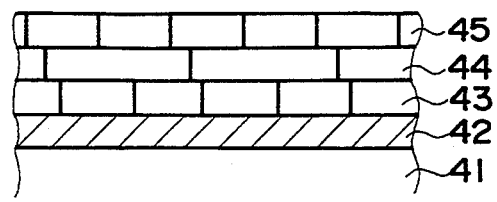
FIG. 8 is a longitudinal cross-sectional view showing the cross-sectional structure of an Al wiring layer formed in accordance with the third embodiment of the method thereof.

FIG. 8 shows a longitudinal cross section of the Al wiring layer formed by changing the film forming speed at three stages in accordance with the third embodiment, in which first, second and third divided Al wiring sublayers 43, 44 and 45 are formed on a silicon oxide film 42 of a semiconductor substrate 41. The crystal grain size is small in the first and third divided Al wiring sublayers 43 and 45 because the film forming speed is high, but the crystal grain size is large in the second divided Al wiring sublayer 44 because the speed is low.

According to the second and third embodiments, as described above, two or three divided Al wiring sublayers of different crystal grain sizes can be laminated. Therefore, the interfaces between adjoining crystal grain boundaries are offset from each other without being arranged in the film thickness direction in the same way as the first embodiment, thus improving the electromigration and stress migration resistances. In this embodiment, since the crystal grain size can be controlled into any desired value by changing the film forming speed, it is possible to obtain the Al wiring layer excellent in reproducibility and uniform in quality. In addition, the film thickness of the divided Al wiring sublayer is controllable precisely to any desired value by controlling the thickness of the Al or Al alloy deposited by sputtering.

Further, the manufacturing step of the second and third embodiments can be simplified in the same way as in the first embodiment. As shown in FIG. 3, the semiconductor substrate is carried into the Al film forming equipment (in step 21); the Al film forming equipment is evacuated into a vacuum (in step 22); the divided Al wiring sublayers are laminated on the semiconductor substrate within the Al film forming equipment by stepwise changing the film forming speed (in step 23); the film forming equipment is deevacuated after the Al wiring layer has been formed (in step 24); and the semiconductor substrate is carried out (in step 25). As described above, since the Al film forming equipment is evacuated and deevacuated one time each, respectively, it is possible to improve the productivity.

The test results of the Al wiring layers formed accordance with the second and third embodiments will be described hereinbelow with respect to the electromigration resistance. A silicon oxide film was formed on a semiconductor substrate, and an Al wiring layer of two- or three-sublayer structure was formed on the silicon oxide film in accordance with the film forming speed of the second or third embodiment. The formed wiring layer was patterned by photoetching method or RIE technique to obtain a 2 μm-wide and 1 μm-long straight wire. The test temperature was 200° C. and the current density was $2.0 \times 10^6$ A/cm$^2$ in the same way as the test of the first embodiment.

Figure 9:
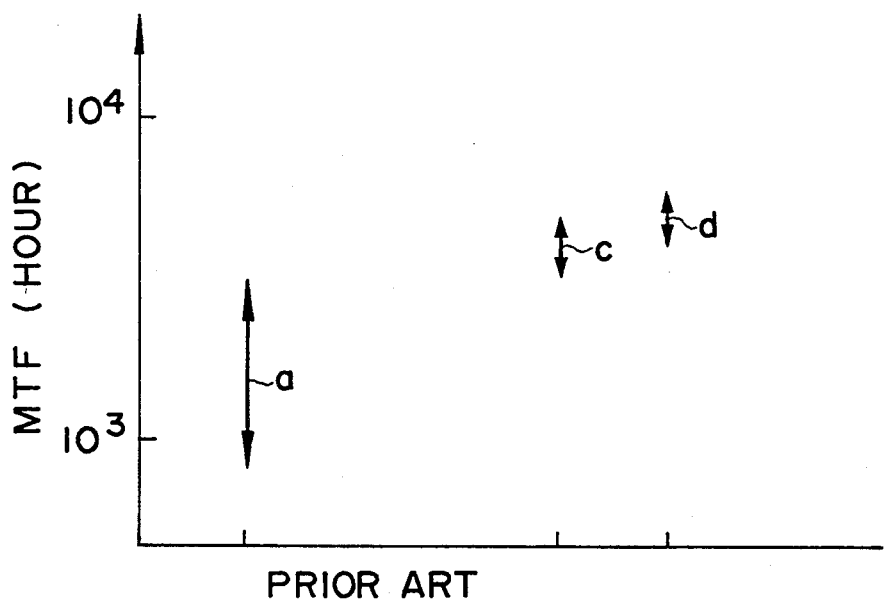
FIG. 9 is a graphical representation showing the test results of comparison between the prior-art method and the second and third embodiments of the method thereof.

FIG. 9 shows the MTF values obtained as the test results, in which a solid line a indicates the MTF values of the Al wiring layers formed by the prior-art method (the same as shown in FIG. 4); a solid line c indicates the values of those formed by the second embodiment; and a solid line d indicates the values of those formed by the third embodiment.

As understood in FIG. 9, the MTF values of the Al wiring layers formed by the prior art range from about 800 to 4000 hours, so that the electromigration resistance is low. In contrast, the MTF values of the Al wiring layers formed by the second embodiment concentrate from about 4000 to 5000 hours, and the values of those formed by the third embodiment concentrate from about 4500 to 5500 hours. This indicates that it is possible to form Al wiring layers excellent in electromigration resistance and with good reproducibility when the Al wiring layers are manufactured by changing the film forming speed at two or more stages as in the second or third embodiment.

In the second and third embodiments, the semiconductor substrates were kept heated at a constant temperature of 500° C. when the Al wiring layers were being formed. However, the tests were made to check the influence of the substrate heating temperature upon the MTF values. FIG. 10 shows the relationship between the substrate heating temperature and the MTF. The Al wiring layers were formed by setting the substrate heating temperature at six different values of 200° C. (solid line e1); 300° C. (e2); 400° C. (e3); 420° C. (e4); 440° C. (e5); and 500° C. (e6). FIG. 10 indicates that the MTF values of the Al wiring layers can be improved markedly when the substrate is heated at 440° C. or higher.

Therefore, it is particularly preferable that the substrate heating temperature is set at 440° C. or higher and the film forming speed is changed at two or more stages when the Al wiring layers are formed in accordance with the second and third embodiments.

Similarly to the first embodiment, the second and third embodiments are not limited to only the above description. For instance, the film forming speed can be changed at at least two stages, and therefore can be changed at four or more stages.

A fourth embodiment of the present invention will be described hereinbelow. This fourth embodiment is characterized in that when the Al wiring layer is formed on the semiconductor substrate formed with a contact hole or a via hole, the semiconductor substrate is heated at 180° C. or lower at the initial stage during which the hole is being buried by Al or Al alloy.

The test results of the influence of the substrate heating temperature at the initial stage upon the occurrence of void in the Al wiring layer will be explained hereinbelow.

An about 1 μm-thick silicon oxide film was formed on a semiconductor substrate and about 1 μm-dia. and 1 μm-deep holes were formed therein by photoetching method and RIE technique. A base film was formed by first forming a 300 Å-thick Ti film on the silicon oxide film and inside the holes by sputtering, and further laminating a 1000 Å-thick TiN film thereon by sputtering.

Four test samples as described above were prepared, and a 0.2 Åm thick Al wiring layer was formed thereon, respectively by changing the substrate heating temperature. Here, the film thickness of 0.2 μm was measured at the flat areas (not within the hole) and the film forming speed was determined at 0.3 (μm/min). The void occurrence status was observed by means of a scanning electron microscope by checking the hole side surfaces in the Al wiring layer.

FIGS. 11(a) to (d) show the inside states of the holes 57 obtained when the substrate heating temperature is set at 150, 180, 210, and 240° C., respectively. As already described, a 1 μm-thick silicon film 51 is formed on the semiconductor substrate 50; a 1 μm-dia. and 1 μm-deep hole 57 is formed in the silicon oxide film 51; and a base film 52 composed of Ti and TiN films are formed thereon.

As shown in FIG. 11(a), when the substrate heating temperature is 150° C., the Al wiring layer 53 is formed relatively flat on the side surfaces of the hole 57 without forming roughness. The same result can be obtained in the case of the Al wiring layer 54 heated at 180° C., as shown in FIG. 11(b) However, as shown in FIG. 11(c), when the substrate heating temperature is 210° C., the Al wiring layer 55 is formed relatively rough inside the hole 57 of the Al wiring layer 55 and therefore uneven surfaces 55a are produced. The same result can be obtained in the case of the Al wiring layer 56 heated at 240° C. as shown in FIG. 11(d).

As described above, when the Al wiring layer is formed so as to bury the hole, it is possible to form the Al film uniformly on the hole side surfaces by heating the substrate at 180° C. or low at the initial stage. The time duration of the initial stage differs according to the diameter and depth of the hole. However, it is possible to determine the initial stage until the thickness of the Al film at the flat portions reaches about 1000 Å.

Further, the inside status of the holes were checked by forming an about 0.2 μm-thick Al wiring layer at different substrate heating temperatures at the initial stage and further forming an about 0.8 μm-thick Al wiring layer thereon by increasing the heating temperature up to 460° C. As shown in FIG. 12(a), no void was produced in the hole when the substrate was heated at 150° C. at the initial stage. Similarly, no void was produced when heated at 180° C. at the initial stage as shown in FIG. 12(b). As shown in FIG. 12(c), however, a void 64 was produced inside the hole 57 of the Al wiring layer 63 when the substrate was heated at 210° C. This may be due to the fact that the Al film becomes rough on the side surfaces of the hole 57, as shown in FIG. 11(c), when heated at 210° C. at the initial stage. Similarly, a void 65 was found when heated at 240° C. at the initial stage as shown in FIG. 12(d).

The above-mentioned results indicate that where the Al wiring layer is formed so as to bury the hole, it is possible to effectively prevent the occurrence of void inside the hole of the Al wiring layer by setting the substrate heating temperature at 180° C. or lower at the initial stage, so that electromigration and stress migration resistances can be improved inside the holes of the Al wiring layer.

Further, after a flat Al film has been formed on the hole side surfaces by heating the substrate at 180° C. or lower at the initial stage, it is desirable to form the Al wiring layer by increasing the heating layer at 460° C. or higher. When the substrate heating temperature is set as described above, it is possible to improve the electromigration and stress migration resistances at the areas other than the holes, as described in the second and third embodiments.

A fifth embodiment of the present invention will be described hereinbelow. Similarly to the fourth embodiment, this embodiment relates to the method of forming an Al wiring layer on a semiconductor substrate formed with holes. This fifth embodiment is characterized in that the film forming speed is reduced intentionally at the initial stage during which the hole is being buried by Al or Al alloy. The film forming speed can be reduced by decreasing the speed and density of ions collided against the Al target in Ar gas, for instance.

Since the film forming speed is slow at the initial stage, Al or Al alloy is gradually deposited inside the hole until the upper portion of the hole is bridged without producing void. When the substrate is heated at 460° C. or higher by reducing the film forming speed at the initial stage, it is possible to more securely prevent the occurrence of void, because the melted Al or Al alloy flows more slowly into the hole to bury it.

The Al wiring layer formed by reducing the film forming speed at the initial stage in accordance with the fifth embodiment has been evaluated as follows:

FIG. 13(a) is a plan view showing evaluating base layers, and FIG. 13(b) is a cross-sectional view taken along the line A—A shown in FIG. 13(a). The evaluating base layers were formed in such a way that: an about 1000 Å thick thermal oxide film 105 was formed on a semiconductor substrate 100; a 5000 Å-thick Al film was formed on the oxide film 105; the Al film was patterned by photoetching method to form 100-piece Al wiring layers 101 with a width of 1.5 μm and a length of 1 mm at intervals of 4 μm so that each Al wiring layer was formed with a 100 μm-square pad 101a on both the ends thereof, respectively; a 1.0 μm thick silicon oxide film 103 was deposited on the Al wiring layers 101 by CVD method; and finally a 1.0 μm dia. through holes 102 were opened over the lower Al wiring layers 1.01 by RIE method.

On the evaluating base layers thus obtained, an Al film with a thickness of 1.0 μm was formed by sputtering, respectively in accordance with the prior art method and the fifth embodiment method. In the case of the prior art method, the film forming speed was fixed at 1.0 μm/min. In the case of the fifth embodiment, the film forming speed was determined at 0.1 μm/min at the initial stage and at 1.0 μm/min thereafter. In both the cases, Al alloy including 1% silicon was used. Al wiring layers with a width of 0.8 μm and a length of 1 mm, respectively were formed by RIE method. FIG. 14(a) is a plane view showing the obtained Al wiring layer and FIG. 14(b) is a longitudinal cross-sectional view taken along the line B—B. As already described, the lower Al wiring layers 101 and the silicon oxide film 105 are formed as a base layer, and contact holes 102 are opened. The Al wiring layers 104 are formed thereon. Further, each upper Al wiring layer 104 is formed with a 100 μm square pad 104a on both ends thereof, respectively.

For both the upper Al wiring layers 104 formed in accordance with the prior art method and the fifth embodiment method, comparative evaluation as to the step coverage in the holes 102 was made by testing the probability of alive holes between the lower Al wiring layers 101 and the upper Al wiring layers 104, after the electromigration test had been made under the conditions that the heating temperature was 200° C.; the current density was $2.0 \times 10^6$ A/cm$^2$; and the test time was 150 hours. FIG. 15 shows the comparative test results of the probability of alive holes. In the case of the prior art method, the probability of alive holes between the upper Al wiring layers 104 and the lower Al wiring layers 101 was as low as 40% of that (100%) of the probability of alive holes of the Al layers formed by the fifth embodiment. As described above, in the fifth embodiment, it has been known that an excellent step coverage performance can be obtained without producing voids, even in relatively deep holes 102 having a diameter of 1 μm and an aspect ratio of 1.0, respectively.

In the above-mentioned fifth embodiment, the film forming speed was determined at 0.1 μm/min at the initial stage and at 1.0 μm/min thereafter. Without being limited thereto, it is also possible to change the film forming speed according to the aspect ratio of the hole. At the initial stage, in particular, the film forming speed is determined slow to such an extent that Al or Al alloy can smoothly bury the holes without being bridged over the holes.

What is claimed is:

1. A method of manufacturing a semiconductor device, wherein when a film is formed by depositing Al or Al alloy on a semiconductor substrate formed with a hole in accordance with sputtering, the film is formed at an initial stage under the condition that the semiconductor substrate is kept heated at 180° C. or lower, after the initial stage, the film is formed in a stepwise manner by stepwise changing the heating temperature of the semiconductor substrate at at least two stages under the condition that the semiconductor substrate is kept heated at a temperature of approximately 460° C. or higher.

2. A method of manufacturing a semiconductor device, comprising the steps of:
    carrying a semiconductor substrate into film forming equipment;
    evacuating the film forming equipment into an almost vacuum;
    forming a film by depositing Al or Al alloy on the semiconductor substrate, the film being formed at an initial stage under the condition that the semiconductor substrate is kept heated at a temperature of 180° C. or lower, after the initial stage, the film is formed in a stepwise manner by stepwise changing the heating temperature of the semiconductor substrate in at least two stages under the condition that the semiconductor substrate is kept heated at a temperature of approximately 460° C. or higher;
    deevacuating the film forming equipment into an almost atmospheric pressure; and
    carrying the semiconductor substrate out of the film forming equipment.

3. The method of claim 2, wherein the initial stage is defined as the stage where thickness of the film formed by depositing Al or Al alloy reaches approximately 1000 Å or more at areas other than the hole.

* * * * *